United States Patent
Koyama (10) Patent No.: US 8,766,715 B2
(45) Date of Patent: Jul. 1, 2014

(54) AMPLIFIER CIRCUIT

(75) Inventor: Kazuo Koyama, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 46 days.

(21) Appl. No.: 13/511,233

(22) PCT Filed: Aug. 29, 2011

(86) PCT No.: PCT/JP2011/004796
§ 371 (c)(1),
(2), (4) Date: May 22, 2012

(87) PCT Pub. No.: WO2012/032736
PCT Pub. Date: Mar. 15, 2012

(65) Prior Publication Data
US 2012/0229205 A1    Sep. 13, 2012

(30) Foreign Application Priority Data

Sep. 10, 2010    (JP) ................................. 2010-203313

(51) Int. Cl.
*H03F 3/45*    (2006.01)
(52) U.S. Cl.
USPC ............................................ 330/69; 330/260
(58) Field of Classification Search
USPC ............................ 330/69, 258, 252, 259, 260
See application file for complete search history.

(56) References Cited

U.S. PATENT DOCUMENTS

| | | | |
|---|---|---|---|
| 5,070,305 A * | 12/1991 | Confalonieri et al. | 330/69 |
| 6,011,435 A * | 1/2000 | Takeyabu et al. | 330/252 |
| 7,106,131 B2 | 9/2006 | Lee et al. | |
| 7,414,467 B2 * | 8/2008 | Blon | 330/69 |
| 7,619,472 B1 * | 11/2009 | Tekin et al. | 330/252 |
| 2002/0118063 A1 | 8/2002 | Jeanjean et al. | |

FOREIGN PATENT DOCUMENTS

| | | |
|---|---|---|
| JP | 61-109309 | 5/1986 |
| JP | 62-168403 A | 7/1987 |
| JP | 4-095406 | 3/1992 |
| JP | 05-055845 | 3/1993 |
| JP | 5-50885 B2 | 7/1993 |
| JP | 08-065067 | 3/1996 |

(Continued)

OTHER PUBLICATIONS

International Preliminary Report on Patentability for corresponding application PCT/JP2011/004796.

(Continued)

*Primary Examiner* — Henry Choe
(74) *Attorney, Agent, or Firm* — Morgan, Lewis & Bockius LLP (57) ABSTRACT

An amplifier circuit capable of reducing load of a circuit at the previous stage by providing increased input impedance producing less noises. The amplifier circuit includes a fully-differential operational amplifier composed of an inverting input terminal, a non-inverting input terminal receiving a signal different from a signal to be input to the inverting input terminal, an inverting output terminal with the same polarity of the inverting input terminal, and a non-inverting output terminal with reverse polarity; an input impedance element with one end connected to the inverting input terminal; an input impedance element with one end connected to the non-inverting input terminal; and positive feedback impedance elements, with one end of connected to the other end of the input impedance element and the other end connected to the inverting output terminal or to the non-inverting output terminal.

10 Claims, 6 Drawing Sheets

(56) References Cited

FOREIGN PATENT DOCUMENTS

| | | |
|---|---|---|
| JP | 08-116223 A | 5/1996 |
| JP | 2000-332548 | 11/2000 |
| JP | 2002-223134 | 8/2002 |
| JP | 2004-320712 | 11/2004 |

OTHER PUBLICATIONS

Japanese Office Action dated Apr. 30, 2013 for corresponding Japanese Patent Application No. 2012-507751.

* cited by examiner

AMPLIFIER CIRCUIT

The present application is the national stage application of PCT/JP2011/004796, filed Aug. 29, 2011, which claims priority to Japanese Patent Application No. 2010-203313, filed Sep. 10, 2010, the contents of which are incorporated herein by reference.

FIELD OF THE INVENTION

The present invention relates to an amplifier circuit, in particular, to an amplifier circuit with a fully-differential operational amplifier.

RELATED ART

An amplifier circuit is, as is well known, a circuit having a capability of amplifying an input signal, which is connected to a different circuit makes up equipment. The amplifier circuit of this kind is usually made requests to have high input impedance, in order to reduce load in connection with power consumption of a circuit at the previous stage to which a signal is input.

Figure 5:
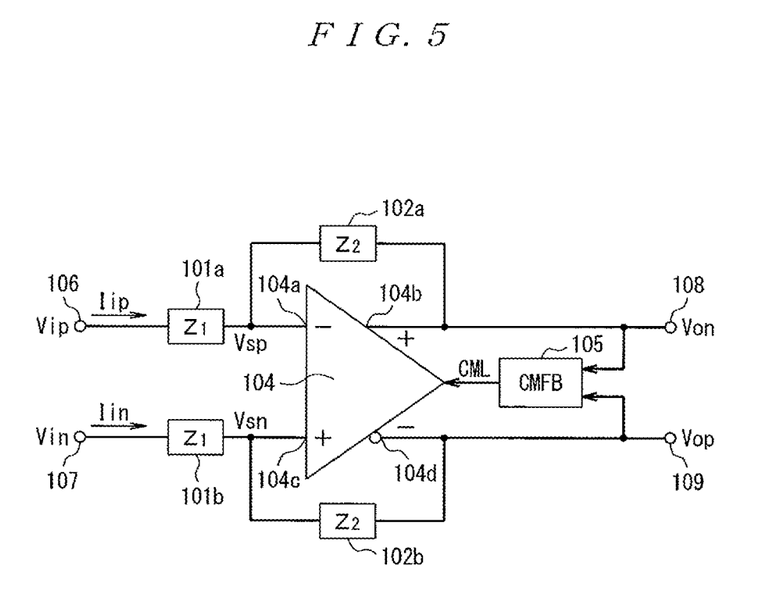
FIG. 5 is a view for explaining a general amplifier circuit.

FIG. 5 is a view for explaining a conventional general amplifier circuit. The amplifier circuit shown in FIG. 5 includes a fully-differential operational amplifier 104, two impedance elements 101a and 101b connected to an inverting input terminal 104a and an non-inverting input terminal 104c of the operational amplifier 104, respectively, and two negative feedback impedance elements 102a and 102b provided between the inverting input terminal 104a and the non-inverting output terminal 104b, and between the non-inverting input terminal 104c and the inverting output terminal 104d. Impedance of the input impedance elements 101a and 101b is both Z1 and impedance of the negative feedback impedance elements 102a and 102b is both Z2.

Also, Vip and Vin depicted in FIG. 5 indicates voltage of a signal to be input to the amplifier circuit, Von and Vop indicate voltage of a signal to be output from the amplifier circuit. Vsn and Vsp are input voltage of the operational amplifier 104. Subscripts "p" and "n" of a symbol indicating the above physical quantity represent a phase of the voltage. The voltage indicated by the subscript "p" and the voltage indicated by the subscript "n" are voltage of which the phase is inverted based on a DC component of an alternating electrical current respectively. Put differently, they have a phase different by 180 degrees from each other.

In the general amplifier circuit shown in FIG. 5, a large impedance value of the input impedance elements 101a and 101b cause problems that one undergoes loud noises produced in the amplifier circuit. Thus, in such prior art, it has been encountered difficulties of incapable of increasing impedance to a sufficient degree.

Figure 6:
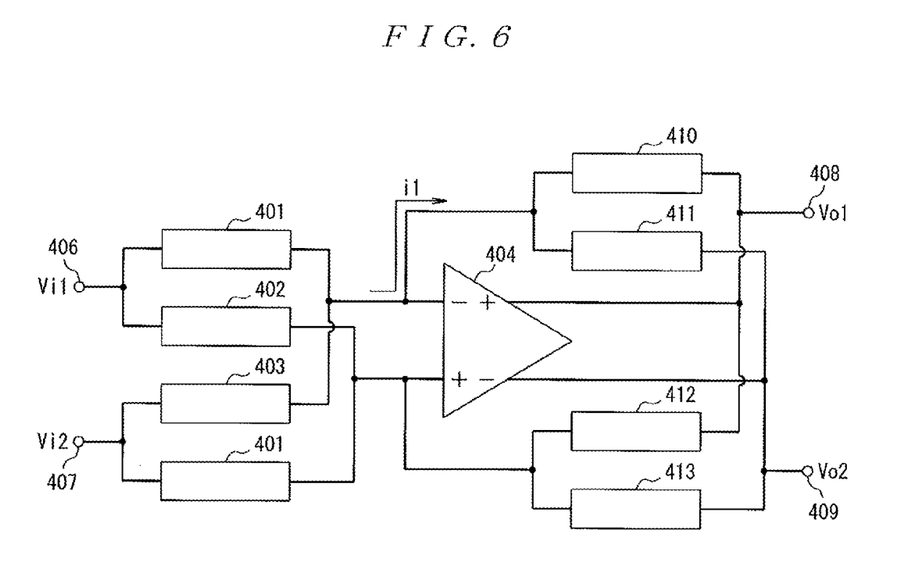
FIG. 6 is a view for explaining a conventional amplifier circuit based on the amplifier circuit illustrated in FIG. 5.

An example of the prior art devised for the purpose of increasing impedance of the amplifier circuit shown in FIG. 5 includes, e.g., an amplifier circuit shown in FIG. 6. The amplifier circuit shown in FIG. 6 includes a fully-differential operational amplifier 404, input impedance elements 401 to 403, and feedback impedance elements 410 to 413. Out of the input impedance elements 401 to 403, the input impedance element 401 is, as with the input impedance elements 101a and 101b shown in FIG. 5, connected to a non-inverting input terminal and an inverting input terminal of the operational amplifier. That is, the amplifier circuit shown in FIG. 6 is one in which input impedance elements 402 and 403 are added to input impedance elements of the amplifier circuit shown in FIG. 5.

With the amplifier circuit of such prior art, it enables making a ratio (Vo/Vi) between voltage Vi to be input to input terminals 406,407 and voltage Vo to be output from output terminals 408,409 higher. Incidentally, such prior art can be found in Patent Document 1.

PRIOR ART DOCUMENT

Patent Document 1: JP 2004-320712 A

SUMMARY OF THE INVENTION

Problem to be Solved

As stated above, for the load of the circuit arranged at the previous stage of the amplifier circuit to reduce to a sufficient degree, it is necessary to reduce electrical currents Iip, Iin, having a phase shifted by 180 degrees from each other, up to about "0". The prior art shown in FIG. 6 is, however, not to intended reducing electrical currents Iip and Iin, but to reduce electrical current i1 flowing through the feedback impedances 410,411.

To reduce noises produced in the amplifier circuit, it is imperative to make impedance values Z1 and Z2 of the input impedance element 101, and the negative impedance element 102 smaller. But, in the prior art shown in FIG. 6, it takes no account of the magnitude of an impedance value of the impedance element. Consequently, the prior art has not been able to provide an amplifier circuit which reduces load of the circuit at the previous stage as well as produces lesser noises.

The present invention is made in view of such shortcoming immanent in the prior art, and its objective is to provide an amplifier circuit which is able to reduce the load of the circuit at the previous stage by increasing input impedance as well as produces lesser noises.

Solution to the Problem

Figure 1:
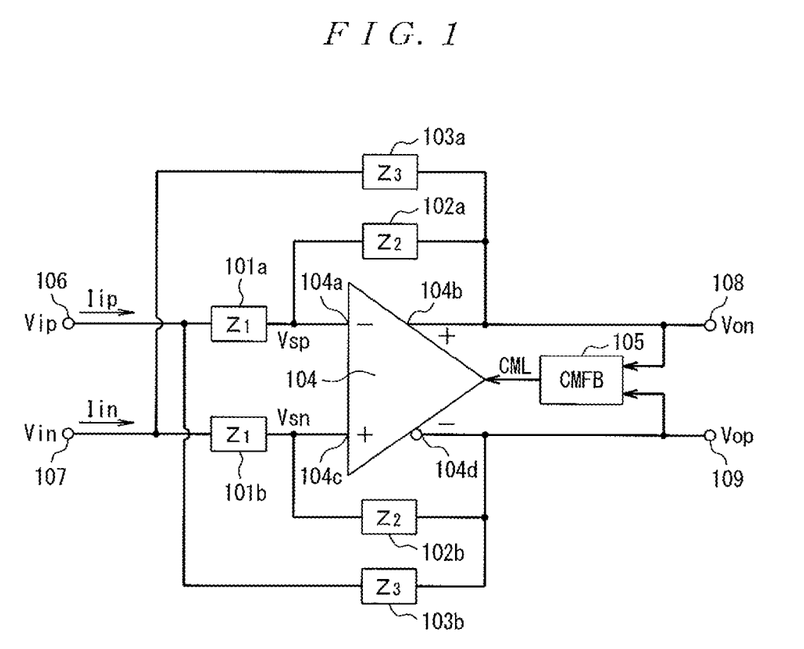
FIG. 1 is a view for explaining an amplifier circuit of a first embodiment of the present invention.

To solve the above-identified problems, an amplifier circuit of one embodiment of the present invention, comprises: a fully-differential operational amplifier (e.g., an operational amplifier 104 shown in FIG. 1) including a first input terminal (e.g., an inverting input terminal 104a shown in FIG. 1), a second input terminal (e.g., a non-inverting input terminal 104c shown in FIG. 1)to which a signal different from a signal to be input to the first input terminal is input, a first output terminal (e.g., an inverting output terminal 104d shown in FIG. 1) with the same polarity as that of the first input terminal, and a second output terminal (e.g., a non-inverting output terminal 104b) with reverse polarity to that of the first input terminal; an input impedance element (e.g., input impedance elements 101a or 101b shown in FIG. 1), one end of which is connected to the first input terminal; and a positive feedback impedance element (e.g., positive feedback impedance elements 103a or 103b shown in FIG. 1), one end of which is connected to the other end of the input impedance element and the other end of which is connected to the first output terminal.

The present invention, it is preferable, in the foregoing invention, that the amplifier circuit should further comprise a negative feedback impedance element (e.g., negative feedback impedance elements 102a or 102b) to be connected between the first input terminal and the second output terminal, and being relation of: $Z3 \geq Z2 - Z1$ among an impedance value Z1 of the input impedance element; an impedance value Z2 of the negative feedback impedance element; and an impedance value Z3 of the positive feedback impedance element.

The present invention is preferable, in the foregoing invention, that the amplifier circuit should further comprise a negative feedback impedance element (e.g., a negative feedback impedance element 102a or 102b shown in FIG. 1)to be connected between the first input terminal and the second input terminal, and being relation of: $Z3 \geq (Z2+Z1) \times (Z2-2 \times Z1) \div (Z2+2 \times Z1)$ among an impedance value Z1 of the input impedance element; an impedance value Z2 of the negative feedback impedance element; and an impedance value Z3 of the positive feedback impedance element.

An amplifier circuit of one embodiment of the present invention comprises: a fully-differential operational amplifier (e.g., an operational amplifier 104 shown in FIG. 1)including a first input terminal (e.g., an inverting input terminal 104a shown in FIG. 1), a second input terminal (e.g., a non-inverting input terminal 104c shown in FIG. 1), a first output terminal (e.g., a non-inverting output terminal 104d shown in FIG. 1) with the same polarity as that of the first input terminal, and a second output terminal (e.g., a non-inverting output terminal 104b shown in FIG. 1) with reverse polarity to that of the first input terminal; a first input impedance element (e.g., an input impedance element 101a shown in FIG. 1) to one end of which an input signal is input and to the other end of which the first input terminal of the operational amplifier is connected; a second impedance element (e.g., an input impedance element 101b shown in FIG. 1) to one end of which an input signal is input different from the input signal and to the other end of which the second input terminal of the operational amplifier is connected; a first negative feedback impedance element (e.g., a negative feedback impedance element 102a shown in FIG. 1), one end of which is connected to the first input terminal and the other end of which is connected to the second output terminal; a second negative feedback impedance element (e.g., a negative feedback impedance element 102b shown in FIG. 1), one end of which is connected to the second input terminal and the other end of which is connected to the first output terminal; a first positive feedback impedance element (e.g., a positive feedback impedance element 103b shown in FIG. 1), one end of which is connected to the first output terminal and the other end of which is connected to one end of the first input impedance element; and a second positive feedback impedance element (e.g., a positive feedback impedance element 103a shown in FIG. 1), one end of which is connected to the second output terminal and the other end of which is connected to one end of the second positive feedback impedance element.

The amplifier circuit of one embodiment is preferable, in the foregoing invention, that an impedance value of the first input impedance element and that of the second input impedance element should be equal, an impedance value of the first negative feedback impedance element and that of the second negative feedback impedance element should be equal, and an impedance value of the first positive feedback impedance element and that of the second positive feedback impedance element should be equal.

The amplifier circuit of one embodiment is preferable, in the foregoing invention, that relation of: $Z3 \geq Z2-Z1$ should be between an impedance value Z1 of the first input impedance element and the second input impedance element, an impedance value Z2 of the first negative feedback impedance element and the second negative feedback impedance element, and an impedance value Z3 of the first positive feedback impedance element and the second positive feedback impedance element.

An amplifier circuit of one embodiment of the present invention comprises: a fully-differential operational amplifier (e.g., an operational amplifier 104 shown in FIG. 3) including a first input terminal (e.g., an inverting input terminal 104a shown in FIG. 3), a second input terminal (e.g., a non-inverting input terminal 104c shown in FIG. 3), a first output terminal (e.g., a inverting output terminal 104d shown in FIG. 3) with the same polarity as that of the first input terminal, and a second output terminal (e.g., a non-inverting output terminal 104b shown in FIG. 3) with reverse polarity to that of the first input terminal; a first input impedance element (e.g., an input impedance element 101a shown in FIG. 3) to one end of which an input signal is input and to the other end of which the first input terminal of the operational amplifier is connected; a second input impedance element (e.g., an input impedance element 101b shown in FIG. 3) to one end of which a reference voltage is input and to the other end of which the second input terminal of the operational amplifier is connected; a first negative feedback impedance element (e.g., a negative feedback impedance element 102a shown in FIG. 3), one end of which is connected to the first input terminal and the other end of which is connected to the second output terminal; a second negative feedback impedance element (e.g., a negative feedback impedance element 102b shown in FIG. 3), one end of which is connected to the second input terminal and the other end of which is connected to the first output terminal; and a positive feedback impedance element (e.g., a positive feedback impedance element 103b shown in FIG. 3), one end of which is connected to the first output terminal and the other end of which is connected to the first input impedance element.

An amplifier circuit of one embodiment of the present invention comprises: a fully-differential operational amplifier (e.g., an operational amplifier 104 shown in FIG. 4) including a first input terminal (e.g., an inverting input terminal 104a shown in FIG. 4), a second input terminal (e.g., a non-inverting input terminal 104c shown in FIG. 4), a first output terminal (e.g., an inverting output terminal 104d shown in FIG. 4) with the same polarity as that of the first input terminal, and a second output terminal (e.g., a non-inverting output terminal 104b shown in FIG. 4) with reverse polarity to that of the first input terminal; a first input impedance element (e.g., an input impedance element 101a shown in FIG. 4) to one end of which an input signal is input and to the other end of which the first input terminal of the operational amplifier is connected; a second input impedance element (e.g., an input impedance element 101b shown in FIG. 4)to one end of which a reference voltage is input and to the other end of which the second input terminal of the operational amplifier is connected; a first negative feedback element (e.g., a negative feedback impedance element 102a shown in FIG. 4), one end of which is connected to the first input terminal and the other end of which is connected to the second output terminal; a second negative feedback impedance element (e.g., a negative feedback impedance element 102b shown in FIG. 4), one end of which is connected to the second input terminal and the other end of which is connected to the first output terminal; and a positive feedback impedance element (e.g., a positive feedback impedance element 103a), one end of which is connected to the second output terminal and the other end of which is connected to one end of the second input impedance element.

The amplifier circuit of one embodiment is preferable, in the foregoing invention, that an impedance value of the first input impedance element and that of the second input impedance element should be equal, and an impedance value of the first negative feedback impedance element and that of the second negative feedback impedance element should be equal.

The amplifier circuit of one embodiment is preferable, in the foregoing invention, that relation of: $Z3 \geq (Z2+Z1) \times (Z2-2 \times Z1) \div (Z2+2 \times Z1)$ should be among an impedance value Z1 of the first input impedance element and the second input impedance element, an impedance value Z2 of the first negative feedback impedance element and the second negative feedback impedance element, and an impedance value Z3 of the positive feedback impedance element.

Advantageous Effect of the Invention

According to the amplifier circuit of the embodiments as mentioned above, since the amplifier circuit includes the positive feedback impedance element provided via the input impedance element connected to the input terminal between the input terminal and the output terminal outputting an signal with a signal to be input from the input terminal of the operational amplifier, the invention may increase input impedance of the amplifier circuit, without incurring an increased impedance value of the input impedance element. On account of this, the invention permits providing an amplifier circuit with high input impedance while reducing noises to be produced in the amplifier circuit.

DESCRIPTION OF EMBODIMENTS

Hereinafter, a description will next be made to a first embodiment and a second embodiment of the present invention with reference to the accompanying drawings.

First Embodiment

Circuit Configuration

FIG. 1 is a view for explaining an amplifier circuit of the first embodiment. The amplifier circuit shown in FIG. 1 includes an operational amplifier 104, two input impedance elements 101a and 101b, two negative feedback impedance elements 102a and 102b, two positive feedback impedance elements 103a and 103b, and a common mode feedback circuit (hereunder, referred to simply as CMFB in FIG. 1) 105. The common mode feedback circuit 105 is a circuit to detect common mode voltage to be output from the operational amplifier 104, and to feedback it. The common mode feedback circuit 105 allows holding the common mode voltage to a constant value.

The operational amplifier 104 is a fully-differential operational amplifier which has inverting input terminals 104a, a non-inverting input terminal 104c to which a signal different from a signal to be input to the inverting input terminals 104a, a non-inverting output terminal 104b having polarity identical with that of the inverting input terminal 104a, and an inverting output terminal 104d with reverse polarity to that of the inverting input terminal 104a. One end of the impedance elements 101a is connected to the inverting input terminal 104a, and the other end of the impedance element is connected to the signal input terminal 106. Further, voltage Vip is applied to a signal input terminal 106 from a circuit at the previous stage. At this time, an electrical current Iip is flown thereinto from the signal input terminal 106.

It is noted that "the signal different from the signal to be input to the inverting input terminal 104a" indicates a signal different in a phase and voltage value to be output simultaneously. Although a signal to be input to the inverting input terminal 104a and a signal to be input to the non-inverting input terminal 104c have an approximately anti-phase relationship between their phases with each other, there are some cases where a phase difference does not exactly amount to 180 degrees depending on a relation of the impedance, etc.

As stated above, a relationship between the two terminals that are respectively allocated to two signals having an approximately anti-phase relation with each other may also be represented as "polarity is reverse". In addition, a relationship between the two terminals that are respectively allocated to two signals having an approximately in-phase relation with each other may also be represented as "polarity is same".

Between the inverting input terminal 104a and the non-inverting output terminal 104b, the negative feedback impedance element 102a is connected. The non-inverting output terminal 104b is connected to a signal output terminal 108. In this instance, voltage of a signal to be output from the signal output terminal 108 is represented as Von.

The non-inverting input terminal 104a is connected via the input impedance element 101a to the signal input terminal 106. Moreover, voltage Vip is input through a circuit at the previous stage from the signal input terminal 106. At this time, an electrical current Iip is flown from the signal input terminal 106.

Between the non-inverting input terminal 104c and the inverting output terminal 104d, the negative feedback impedance element 102b is connected. The inverting output terminal 104d is connected to the signal output terminal 109. At this time, voltage of a signal to be output from the signal output terminal 109 is represented as Vop.

The non-inverting input terminal 104c is connected via the input impedance element 101b to the signal input terminal 107. Further, voltage Vin is input through a circuit at the previous stage through the signal input terminal 107. On this occasion, an electrical current Iin is flown from the signal input terminal 107.

Furthermore, in the first embodiment, the positive feedback impedance element 103b is provided, one end of which is connected to one end of the input impedance element 101a and the other end of which is connected to the inverting output terminal 104d. Also, the positive feedback impedance element 103a is provided, one end of which is connected to the other end of the input impedance element 101b and the other end of which is connected to the non-inverting output terminal 104b.

Out of the impedance elements mentioned above, in the first embodiment, letting an input impedance value of the input impedance elements 101a and 101b to be Z1, an impedance value of the negative feedback impedance elements 102a and 102b to be Z2, and an impedance value of the positive feedback impedance elements 103a and 103b to be Z3.

The signal input terminals 106,107 are terminals for inputting an input signal from the circuit at the previous stage to the amplifier circuit. A differential signal having a phase different by 180 degrees from each other is input, as an input signal, to the signal input terminals 106,107. Moreover, a differential signal is output, as an output signal, from the signal output terminals 108,109.

Subscripts "n" and "p" shown in FIG. 1 are ones for indicating polarity of a phase of signal. It has relation of antipolarity between a signal indicated by the subscript "n" and a signal indicated by the subscript of "p". Furthermore, it has relation of homopolarity between signals to which a subscript "n" is appended and signals to which a subscript "n" is appended.

Figure 2:
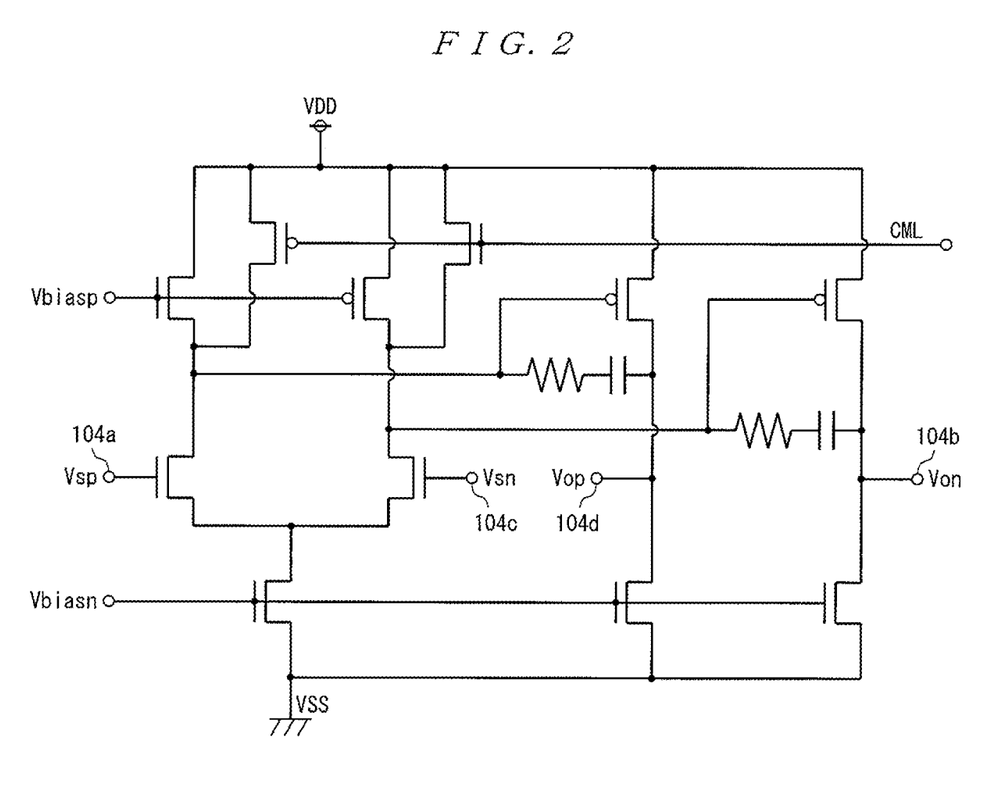
FIG. 2 is a circuit diagram for explaining the inside of an amplifier circuit shown in FIG. 1.

FIG. 2 is a circuit diagram for explaining the inside of the operational amplifier 104 shown in FIG. 1. In FIG. 2, an inverting input terminal 104a, a non-inverting input terminal 104c, a non-inverting output terminal 104b, and an inverting output terminal 104d respectively correspond to the terminals with same name.

Further, as shown in FIG. 2, a positive power supply voltage VDD, a negative power supply voltage VSS, Vbiasp, and Vbiasn for determining an electrical current to be flown through the operational amplifier 104 are applied to the operational amplifier 104.

Operation

An explanation will next be made to an operation of the operational amplifier of the first embodiment described above by using equations.

(1) Operation of Conventional Amplifier Circuit

Herein, to compare with an operation of the amplifier circuit of the first embodiment, an explanation will be made first to an operation of the conventional amplifier circuit shown in FIG. 5 by using equations. In this section, voltage Vip, Von, Vin, Vop, Vsn, Vsp, Z1, and Z2 are physical quantity all depicted in FIG. 5, or written in the description of FIG. 5.

In the conventional amplifier circuit shown in FIG. 5, a condition where the sum of electrical currents at a node to which Vsp shown in FIG. 5 is applied is expressed following the Kirchhoff's law by the following equation (1)

$$(Vip-Vsp)/Z1+(Von-Vsp)/Z2=0 \quad \text{equation (1)}$$

Equation (2) is obtained by changing the equation (1).

$$(1/Z1+1/Z2)Vsp=Vip/Z1+Von/Z2 \quad \text{equation (2)}$$

Likewise, as for a node to which voltage Vsn in FIG. 5 is applied the following equations (3) and (4) are obtained.

$$(Vin-Vsn)/Z1+(Vop-Vsn)/Z2=0 \quad \text{equation (3)}$$

$$(1/Z1+1/Z2)Vsn=Vin/Z1+Vop/Z2 \quad \text{equation (4)}$$

To find out differential output voltage Vop−Von, subtracting both sides of the equation (4) from the equation (2) obtains the following equation.

$$(1/Z1+1/Z2)(Vsp-Vsn) = (Vip-Vin)/Z1+(Von-Vop)/Z2$$

If a gain of the operational amplifier 104 is sufficiently high, the following equation (5) is obtained as one can be regarded voltage Vsp, Vsn as having relation if Vsp=Vsn.

$$Vop-Von=Z2(Vip-Vin)/Z1 \quad \text{equation (5)}$$

From the equation (5), it can be seen that the amplifier circuit shown in FIG. 5 is an amplifier circuit with a gain of Z2/Z1.

Herein, since common voltage (Von+Vop)/2 of an output signal is controlled so as to be the analog ground (assumed to be 0) by the common mode feedback circuit 105, the following equation is obtained from relation between the equation (5) and (Vop+Vop)/2=0.

$$Vop-Von=2Vop=Z2(ViP-Vin)/Z1$$

Equation (6) is obtained by changing the above equation. Where, in equation (6), (let Vin,Vip to be) Vin=−Vip.

$$Vop=Z2(Vip-Vin)/2Z1=Vip-Z2/Z1 \quad \text{equation (6)}$$

On the other hand, in order to find out the input voltage Vsp and Vsn of the operational amplifier 104, the both sides of the equations (2), (4) are respectively added to derive the following equation.

$$(1/Z1+1/Z2)(Vsp-Vsn) = (Vip+Vin)/Z1+(Von+Vop)/Z2$$

Equation (7) is obtained by changing the above equation.

$$(vsp+Vsn)/2 = (Vip+Vin)/Z1/2/(1/Z1+1/Z2) + \quad \text{equation (7)}$$
$$(Vop+Von)/Z2/2/(1/Z1+1/Z2) =$$
$$Z2(Vip+Vin)/2/(Z1+Z2) +$$
$$Z1(Vop+Von)/2/(Z1+Z2)$$

If a gain of the operational amplifier 104 is sufficiently high, one can be regarded voltage Vsp and Vsn as having relation of Vsp=Vsn. Further, the equation (7) becomes equation (8) as relation of Vin=−Vip and Von=−Vop are between these physical quantity.

$$Vsp=Vsn=0 \quad \text{equation (8)}$$

Then, input impedance values Zip and Zin of the amplifier circuit shown in FIG. 5 are found.

Following the Kirchhoff's law, a condition where the total of an electrical current Iip to be flown to a node to which the voltage Vip is applied is expressed as the following equation (9).

$$Iip+(Vsp-Vip)/Z1=0 \quad \text{equation (9)}$$

Where, Iip is an input electrical current to be flown from the outside (circuit at the previous stage) to the amplifier circuit.

Equation (10) is obtained from equations (8) and (9).

$$Iip=(Vip-Vsp)/Z1=Vip/Z1 \quad \text{equation (10)}$$

Thus, the input impedance value Zip of the amplifier circuit show in FIG. 5 is expressed by the following equation (11).

$$Zip=Vip/Iip=Z1 \quad \text{equation (11)}$$

Likewise, the input impedance value Zin is expressed by the equation (12).

$$Zin=Vin/Iin=Z1 \quad \text{equation (12)}$$

From the above, it can be seen that the conventional amplifier circuit has finite input impedance of Zip and Zin.

(2) Operation of Amplifier Circuit of First Embodiment

Next, an explanation will be made to an operation of the amplifier circuit of the first embodiment shown in FIG. 1.

In the amplifier circuit shown in FIG. 1, a condition where the total of electrical current to be flown to a node to which voltage Vsp is applied is expressed by the following equation (13) following the Kirchhoff's law.

$$(Vip-Vsp)/Z1+(Von-Vsp)/Z2=0 \quad \text{equation (13)}$$

Likewise, as for a node to which Vsn is applied, the following equation (14) is obtained.

$$(Vin-Vsn)/Z1+(Vop-Vsn)/Z2=0 \quad \text{equation (14)}$$

Because the equations (13) and (14) are same to the equation of the conventional amplifier circuit, the aforesaid equations (1) to (8) are established even in the amplifier circuit of the first embodiment.

After that, electrical currents Iip and Iin to be input from the outside to the amplifier circuit of the first embodiment are obtained.

In FIG. 1, a condition where the total of electrical current to be flown to a node to which voltage Vip is applied expressed by the following equation (15) following the Kirchhoff's law is.

$$Iip+(Vsp-Vip)/Z1+(Vop-Vip)/Z3=0 \quad \text{equation (15)}$$

Equation (16) is obtained by changing equation (15).

$$Iip+Vsp/Z1+Vop/Z3-(1/Z1+1/Z3)Vip=0 \quad \text{equation (16)}$$

Equation (6) is substituted for equation (16). If a gain of the operational amplifier 104 is sufficiently high, and equation (16) is as follows as one can be regarded voltage Vsp as having relation of Vsp=0.

$$Iip+Z2 \cdot Vip/(Z1-Z3)-(1/Z1+1/Z3)Vip=0$$

Equation (17) is obtained by changing the above equation.

$$Iip = \{1/Z1 + 1/Z3 - Z2/(Z1 \cdot Z3)\}Vip \quad \text{equation (17)}$$
$$= \{(Z1 - Z2 + Z3)/(Z1 \cdot Z3)\}Vip$$

Accordingly, an input impedance value Zip of the amplifier circuit of the first embodiment is expressed as the following equation (18).

$$Zip=Vip/Iip=Z1 \cdot Z3/(Z1-Z2+Z3) \quad \text{equation (18)}$$

Likewise, an impedance value Zin is obtained by the following equation (19).

$$Zin=Vin/Iin=Z1 \cdot Z3/(Z1-Z2+Z3) \quad \text{equation (19)}$$

With the above equations (18) and (19), if the impedance values Z1, Z2, and Z3 are set so as to have relation of Z3≥Z2−Z1, it will be possible to realize an amplifier circuit with high input impedance values Zip and Zin without oscillating the amplifier circuit.

Here, if we assume Z1, Z2, and Z3 to have relation of Z3=Z2−Z1, an input impedance will be turned into infinity. Nonetheless, in order to avoid oscillation of the amplifier circuit, it is realistic that an impedance value Z3 is set slightly larger than impedance value Z2−Z1. For this reason, Z3 of the first embodiment has relation of Z3≥Z2−Z1 in which its minimum value is Z2−Z1.

Further, in the first embodiment, there is an occurrence in some cases that a design value of the impedance elements 103*a* and 103*b* is set, to realize such a condition, so as to amount to 80% or so of the impedance value Z3 to be implemented by the impedance elements 103*a* and 103*b*.

Alternatively, in the above-mentioned first embodiment, the impedance elements 101*a*, 101*b*, 102*a*, 102*b*, 103*a* and 103*b* may utilize any elements, as far as they function as an impedance element in the amplifier circuit, such as a capacitance element or a resistance element. It should be noted that since variations in characteristics among these impedance elements impair circuit characteristics of the amplifier circuit of the first embodiment, it is desirable to employ an impedance element of which electrical characteristic and temperature characteristic are matched, as can as possible, as each impedance element. By way of example of elements having matched characteristics, it is desirable to employ not only elements which are fabricated according to the same design and process but also elements which are mounted on the same wafer.

Second Embodiment

Circuit Configuration

Figure 3:
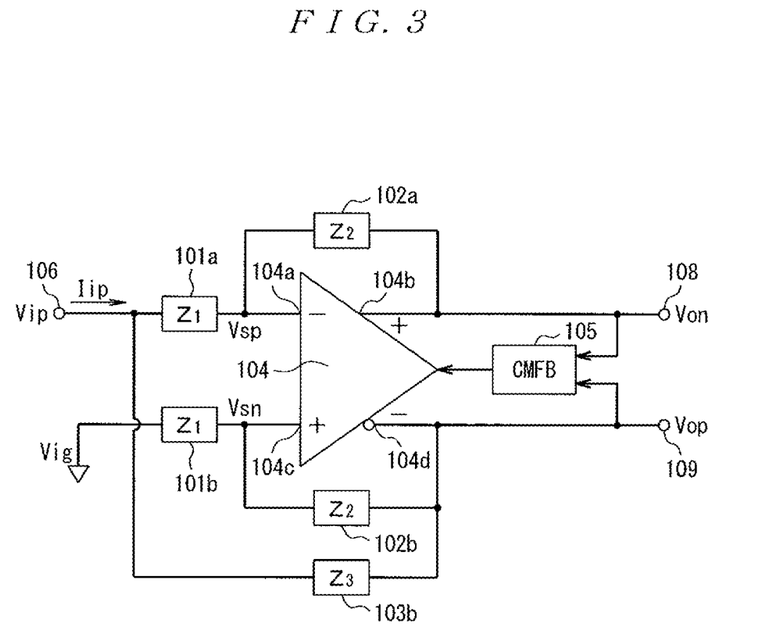
FIG. 3 is a view for explaining an amplifier circuit of a second embodiment of the present invention.

FIG. 3 is a view for explaining the amplifier circuit of the second embodiment of the present invention. Out of the circuits shown in FIG. 3, the same circuit having the same configuration as those shown in FIG. 1 is denoted by the same reference numeral, and a part of descriptions thereof shall be omitted for simplification. The amplifier circuit of the second embodiment differs from that of the first embodiment in which the amplifier circuit has a fully-differential configuration, in that an input section takes a single ended configuration. In other words, in the second embodiment, the other end of the input impedance element 101*b* is connected to the analog ground that is a reference voltage.

The amplifier circuit of the second embodiment includes a signal input terminal 106 to input from the outside an input signal to the other end of the input impedance element 101*a*, and a positive feedback impedance element 103*b* of which one end is connected to the other end of the input impedance element 101*a* and the other end of which is connected to the inverting output terminal 104*d*.

Operation

An explanation will next be made to an operation of the amplifier circuit of the second embodiment shown in FIG. 3 by using equations.

In the amplifier circuit shown in FIG. 3, a condition where the total of the electrical current to be flown becomes 0 to a node to which the voltage Vsp is applied according to the Kirchhoff's law is expressed as the following equation (20).

$$(Vip-Vsp)/Z1+(Von-Vsp)/Z2=0 \quad \text{equation (20)}$$

Equation (21) is obtained by changing equation (20).

$$(1/Z1+1/Z2)Vsp=Vip/Z1+Von/Z2 \quad \text{equation (21)}$$

Likewise, as for a node to which the voltage Vsn is applied, the following equations (22) and (23) are obtained.

$$(0-Vsn)/Z1+(Von-vsn)/Z2=0 \quad \text{equation (22)}$$

$$(1/Z1+1/Z2)Vsn=Vop/Z2 \quad \text{equation (23)}$$

To find out differential output voltage Vop-Von, subtracting the both sides of equation (23) from equation (21) respectively, the following equation is obtained.

$$(1/Z1+1/Z2)(Vsp-Vsn)=Vip/Z1+(Von-Vop)/Z2$$

If a gain of the operational amplifier 104 is sufficiently high, the following equation (24) is obtained as one can be regarded voltage Vsp, Vsn as having relation of Vsp=Vsn.

$$Vop-Von=(Z2/Z1)Vip \quad \text{equation (24)}$$

From the equation (24), it can be seen that the amplifier circuit shown in FIG. 3 is an amplifier circuit with a gain of Z2/Z1.

Herein, as common voltage (Von+Vop)/2 of an output signal is controlled so as to be the analog ground (assumed to be 0) by the common mode feedback circuit 105, the following equation is obtained from relation between the equation (24) and (Von+Vop)/2=0.

$$Vop-Von=2Vop=(Z2/Z1)Vip$$

Equation (25) is obtained by changing the above equation.

$$Vop = \{Z2/(2Z1)\}Vip \qquad \text{equation (25)}$$

In the meanwhile, to find out input voltages Vsp and Vsn of the operational amplifier 104, the both sides of equations (21) and (23) are respectively added to derive the following equation.

$$(1+/Z1+1/Z2)(Vsp+Vsn) = Vip/Z1 + (Von+Vop)/Z2$$

Equation (26) is obtained by changing the above equation.

$$(Vsp + Vsn)/2 = Vip/Z1/2/(1/Z1 + 1/Z2) + \qquad \text{equation (26)}$$
$$(Vop + Von)/Z2/2/(1/Z1 + 1/Z2) =$$
$$Z2 \cdot Vip/2/(Z1 + Z2) + Z1(Vop + Von)/2/(Z1 + Z2)$$

If a gain of the operational amplifier 104 is sufficiently high, as one can be regarded voltage Vsp and Vsn as having relation of Vsp=Vsn, equation (26) is deformed to equation (27). Further, as Von=-Vop, equations (26) is simplified to equation (27).

$$Vsp = Vsn = Z2 \cdot Vip/2/(Z1+Z2) \qquad \text{equation (27)}$$

An electrical current Iip to be input from the outside to the amplifier circuit of the second embodiment is then found.

In FIG. 3, a condition where the total of the electrical current Iip to be flown to a node to which the voltage Vip is applied is expressed according to the Kirchhoff's law as the following equation (28).

$$Iip + (Vsp-Vip)/Z1 + (Vop-Vip)/Z3 = 0 \qquad \text{equation (28)}$$

Equation (29) is obtained by changing the equation (28).

$$Iip + Vsp/Z1 + Vop/Z3 - (1/Z1 + 1/Z3)Vip = 0 \qquad \text{equation (29)}$$

Substituting the equations (25) and (27) for the equation (29), the equation (29) is as follows.

$$Iip + Z2 \cdot Vip/\{2(Z1+Z2)Z1\} + Z2 \cdot Vip/(2Z1 \cdot Z3) - (1/Z1 + 1/Z3)Vip = 0$$

Equation (30) is obtained by changing the above equation.

$$Iip = [1/Z1 + 1/Z3 - Z2/\{2(Z1+Z2)Z1\} - Z2/(2Z1 \cdot Z3)] \qquad \text{equation (30)}$$
$$Vip = [(2Z1^2 + 2Z1 \cdot Z3 + Z2 \cdot Z3 + Z1 \cdot Z2 - Z2^2)/$$
$$\{2Z1 \cdot Z3(Z1+Z2)\}]Vip$$

Accordingly, the input impedance value Zip of the amplifier circuit of the second embodiment is expressed as the following equation (31).

$$Zip = Vip/Iip = \{2Z1 \cdot Z3(Z1+Z2)\}/ \qquad \text{equation (31)}$$
$$(2Z1^2 + 2Z1 \cdot Z3 + Z2 \cdot Z3 + Z1 \cdot Z2 - Z2^2)$$

Selecting the impedance value Z3 so as to close to 0 within the limits where a denominator of the above equation (31) becomes positive enables actualizing high input impedance. That is, setting the impedance values Z1,Z2, and Z3 to have relation of $Z3 \geq (Z2+Z1) \cdot (Z2-2Z1)/(Z2+2Z1)$ enables implementing an amplifier circuit with high input impedance values Zip Zin without oscillating the amplifier circuit.

Herein, if it is impedance values Z1,Z2, and Z3 to have relation of $Z3=(Z2+Z1) \cdot (Z2-2Z1)/(Z2+2Z1)$, this will allow input impedance to be infinity. However, in order to avoid oscillation of the amplifier circuit, it is realistic that an impedance value Z3 is set slightly larger than the impedance values $(Z2+Z1) \cdot (Z2-2Z1)/(Z2+2Z1)$. On this account, Z3 of the second embodiment has relation of $Z3 \geq (Z2+Z1) \cdot (Z2-2Z1)/(Z2+2Z1)$ in which its minimum value is $(Z2+Z1) \cdot (Z2-2Z1)/(Z2+2Z1)$.

Figure 4:
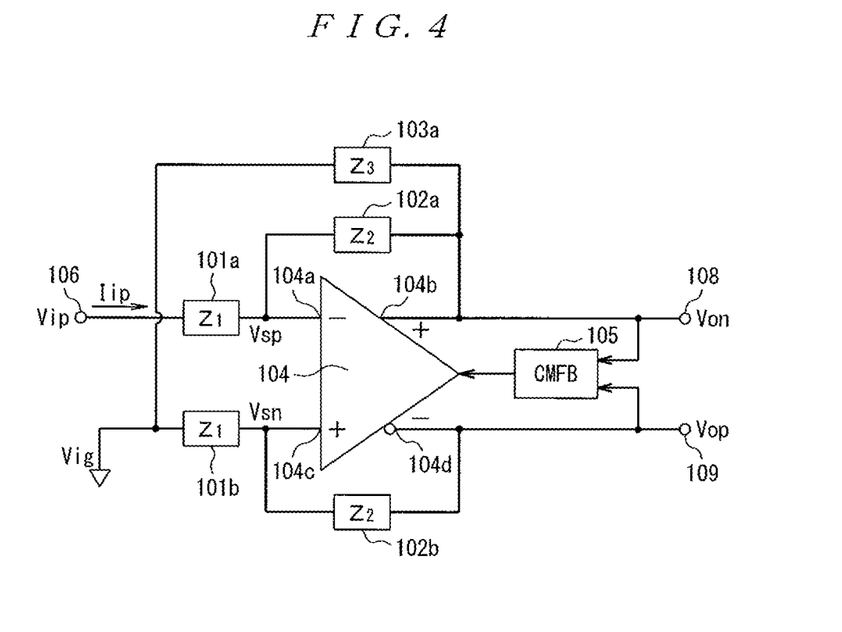
FIG. 4 is a view for explaining a variant of the second embodiment of the present invention.

In the second embodiment as described above, one end of the positive feedback impedance element 101a is connected to the other end of the input impedance element 103b and the other end of which is connected to the inverting output terminal 104d. However, it is to be aware of that the second embodiment is not necessarily limited to such circuit configuration. For example, instead thereof, it doesn't matter that one end of the positive feedback impedance element 103a may be connected to the other end of the input impedance element 101b and the other end of which may be connected to the positive feedback impedance element 103a, as shown in FIG. 4.

INDUSTRIAL APPLICABILITY

The amplifier circuit of the embodiment as described above may be applied to any amplifier circuit, as long as a differential output amplifier which is urged to have high input impedance while mitigating noises to be produced inside of the amplifier circuit.

REFERENCE SIGNS LIST 101a,101b: input impedance element
102a,102b: negative feedback impedance element
103a,103b: positive feedback impedance element
104: operational amplifier
104a: inverting input terminal
104b: non-inverting output terminal
104c: non-inverting input terminal
104d: inverting output terminal
105: common mode feedback circuit
106,107: signal input terminal
108,109: signal output terminal

The invention claimed is:

1. An amplifier circuit comprising:
a fully-differential operational amplifier including a first input terminal, a second input terminal to which a signal different from a signal to be input to the first input terminal is input, a first output terminal with the same polarity as that of the first input terminal, and a second output terminal with reverse polarity to that of the first input terminal;
an input impedance element, one end of which is connected to the first input terminal;
a positive feedback impedance element, one end of which is connected to the other end of the input impedance element and the other end of which is connected to the first output terminal; a negative feedback impedance element to be connected between the first input terminal and the second output terminal, wherein relation of: $Z3 \geq (Z2+Z1) \times (Z2-2 \times Z1)$ divided by $(Z2+2 \times Z1)$ is among an impedance value Z1 of the input impedance element; an impedance value Z2 of the negative feedback impedance element; and an impedance value Z3 of the positive feedback impedance element.

2. The amplifier circuit according to claim 1, further comprising a negative feedback impedance element to be connected to the first input terminal and the second output terminal, wherein relation of:

$$Z3 \geq Z2 - Z1$$

is among an impedance value Z1 of the input impedance element;
an impedance value Z2 of the negative feedback impedance element; and
an impedance value Z3 of the positive feedback impedance element.

3. The amplifier circuit according to claim 1, further comprising a negative feedback impedance element to be connected between the first input terminal and the second output terminal, wherein relation of:

$$Z3 \geq (Z2+Z1) \times (Z2-2 \times Z1) \div (Z2+2 \times Z1)$$

is among an impedance value Z1 of the input impedance element;
an impedance value Z2 of the negative feedback impedance element; and
an impedance value Z3 of the positive feedback impedance element.

4. An amplifier circuit comprising:
a fully-differential operational amplifier including a first input terminal, a second input terminal, a first output terminal with the same polarity as that of the first input terminal, and a second output terminal with reverse polarity to that of the first input terminal;
a first input impedance element to one end of which an input signal is input and to the other end of which the first input terminal of the operational amplifier is connected;
a second impedance element to one end of which an input signal is input different from the input signal and to the other end of which the second input terminal of the operational amplifier is connected;
a first negative feedback impedance element, one end of which is connected to the first input terminal and the other end of which is connected to the second output terminal;
a second negative feedback impedance element, one end of which is connected to the second input terminal and the other end of which is connected to the first output terminal;
a first positive feedback impedance element, one end of which is connected to the first output terminal and the other end of which is connected to one end of the first input impedance element; and
a second positive feedback impedance element, one end of which is connected to the second output terminal and the other end of which is connected to one end of the second input impedance element.

5. The amplifier circuit according to claim 4, wherein an impedance value of the first input impedance element and that of the second input impedance element are equal, an impedance value of the first negative feedback impedance element and that of the second negative feedback impedance element are equal, and an impedance value of the first positive feedback impedance element and that of the second positive feedback impedance element are equal.

6. The amplifier circuit according to claim 5, wherein relation of:

$$Z3 \geq Z2 - Z1$$

is among an impedance value Z1 of the first input impedance element and the second input impedance element, an impedance value Z2 of the first negative feedback impedance element and the second negative feedback impedance element, and an impedance value Z3 of the first positive feedback impedance element and the second positive feedback impedance element.

7. An amplifier circuit comprising:
a fully-differential operational amplifier including a first input terminal, a second input terminal, a first output terminal with the same polarity as that of the first input terminal, and a second output terminal with reverse polarity to that of the first input terminal;
a first input impedance element to one end of which an input signal is input and to the other end of which the first input terminal of the operational amplifier is connected;
a second input impedance element to one end of which a reference voltage is input and to the other end of which the second input terminal of the operational amplifier is connected;
a first negative feedback impedance element, one end of which is connected to the first input terminal and the other end of which is connected to the second output terminal;
a second negative feedback impedance element, one end of which is connected to the second input terminal and the other end of which is connected to the first output terminal; and
a positive feedback impedance element, one end of which is connected to the first output terminal and the other end of which is connected to the first input impedance element.

8. An amplifier circuit comprising:
a fully-differential operational amplifier including a first input terminal, a second input terminal, a first output terminal with the same polarity as that of the first input terminal, and a second output terminal with reverse polarity to that of the first input terminal;
a first input impedance element to one end of which an input signal is input and to the other end of which the first input terminal of the operational amplifier is connected;
a second input impedance element to one end of which a reference voltage is input and to the other end of which the second input terminal of the operational amplifier is connected;
a first negative feedback element, one end of which is connected to the first input terminal and the other end of which is connected to the second output terminal;
a second negative feedback impedance element, one end of which is connected to the second input terminal and the other end of which is connected to the first output terminal; and
a positive feedback impedance element, one end of which is connected to the second output terminal and the other end of which is connected to one end of the second input impedance element.

9. The amplifier circuit according to claim 7 or claim 8, wherein an impedance value of the first input impedance element and that of the second input impedance element are equal, and an impedance value of the first negative feedback impedance element and that of the second negative feedback impedance element are equal.

10. The amplifier circuit according to claim 7 or claim 8, wherein relation of:

$$Z3 \geq (Z2+Z1) \times (Z2-2 \times Z1) \div (Z2+2 \times Z1)$$

is among
- an impedance value Z1 of the first input impedance element and the second input impedance element,
- an impedance value Z2 of the first negative feedback impedance element and the second negative feedback impedance element, and
- an impedance value Z3 of the positive feedback impedance element.

* * * * *